United States Patent [19]

Kobayashi et al.

[11] Patent Number: 4,565,840
[45] Date of Patent: Jan. 21, 1986

[54] FIBER-REINFORCED CONCRETE AND REINFORCING MATERIAL FOR CONCRETE

[75] Inventors: Kazusuke Kobayashi, Sagamihara; Ryokche Cho, Yokohama, both of Japan

[73] Assignee: Mitsui Petrochemical Industries, Ltd., Tokyo, Japan

[21] Appl. No.: 619,344

[22] Filed: Jun. 11, 1984

Related U.S. Application Data

[63] Continuation of Ser. No. 223,717, Jan. 9, 1981, abandoned.

[30] Foreign Application Priority Data

Jan. 11, 1980 [JP] Japan .................................. 55-2280

[51] Int. Cl.$^4$ .............................................. E04C 5/00
[52] U.S. Cl. .......................................... 524/8; 52/659; 106/99; 428/399; 428/400
[58] Field of Search ...................... 52/659; 106/99, 93; 428/400, 399

[56] References Cited

U.S. PATENT DOCUMENTS

| 3,834,916 | 9/1974 | Kesler ...................................... 106/99 |
| 3,953,953 | 5/1976 | Marsden . |
| 4,062,913 | 12/1977 | Miller ...................................... 106/99 |
| 4,240,840 | 12/1980 | Downing ............................... 106/79 |
| 4,297,414 | 10/1981 | Matsumoto ........................... 52/659 |

FOREIGN PATENT DOCUMENTS

| 1305206 | 1/1973 | United Kingdom . |
| 1335427 | 10/1973 | United Kingdom . |
| 1406422 | 9/1975 | United Kingdom . |
| 2025841 | 1/1980 | United Kingdom . |

*Primary Examiner*—Henry E. Raduazo
*Attorney, Agent, or Firm*—Burns, Doane, Swecker & Mathis

[57] ABSTRACT

A fiber-reinforced concrete comprising two kinds of short fibers, one being a short fiber having a Young's modulus higher than that of concrete, the other being a short fiber which has a Young's modulus lower than that of concrete and showing good adhesiveness to concrete. The both fibers are mixed in a predetermined ratio and dispersed in a concrete matrix. A reinforcing material for concrete is also disclosed which material consisting of such fibers as mentioned above.

16 Claims, 9 Drawing Figures

FIBER-REINFORCED CONCRETE AND REINFORCING MATERIAL FOR CONCRETE

This application is a continuation of application Ser. No. 223,717, filed Jan. 9, 1981 and now abandoned.

BACKGROUND OF THE INVENTION

1. Field of the Invention

This invention relates to fiber-reinforced concretes. More particularly, it relates to composite materials obtained by uniformly dispersing short fibers in mortars or concretes and also to reinforcing materials, i.e. short fibers to be incorporated in the concrete.

2. Description of the Prior Art

It is known to incorporate or disperse in concretes a reinforcing material such as steel fibers in order to improve tensile and flexural strengths of the concrete. Such a technique has been already disclosed in U.S. Pat. No. 3,953,953 and the reinforced concretes have been practically used as a paving material or a lining of tunnel because of their excellent characteristics. The fiber-reinforced concretes are incorporated ensure higher crazing and maximum loads as compared with ordinary concretes but have a drawback that high toughness cannot be expected since the impartment of toughness is dependent on whether the short fiber is easily withdrawn from a concrete matrix.

It is also known that when a reinforcing material of a synthetic plastic fiber is incorporated in concrete, the concrete can stand against a fairly great degree of deformation and is remarkably improved in toughness such as disclosed in British Pat. No. 1,305,206. But they have a drawback in that the craze resistance is small, i.e. an initial yield strength or proof stress is small.

Compare also British Patent Specification No. 1,406,442 featuring "a mix for making reinforced concrete comprising cement, sand, aggregate, strands formed of at least two fibres twisted together and/or individual fibres and water, the strands and/or fibres being of various lengths and cross-sectional dimensions."

SUMMARY OF THE INVENTION

It is an object of the invention to provide a fiber-reinforced concrete which overcomes the disadvantages of prior art counterparts.

It is another object of the invention to provide a fiber-reinforced concrete having predetermined amounts of two kinds of short fibers (A) and (B) incorporated or dispersed in concrete whereby the disadvantages of concretes where such short fibers are singly incorporated can be eliminated.

It is a further object of the invention to provide a fiber-reinforced concrete which has a remarkably improved craze resistance and an increased toughness.

It is a still further object of the invention to provide a reinforcing material composed of two different kinds of short fibers.

The above objects can be achieved by a fiber-reinforced concrete which comprises a concrete matrix, and predetermined amounts of a short fiber (A) having a Young's modulus higher than that of the concrete and a short fiber (B) having a Young's modulus lower than that of the concrete but showing good affinity for or adhesiveness to the concrete, the both fibers having been dispersed in the matrix. By this, the reinforced concrete shows an improved yield strength, (which will be lowered after generation of crazes in the case of a concrete in which the short fiber (B) alone is incorporated,) by the addition of the short fiber (A) showing a craze-resistant tendency and a rapid lowering of the yield strength of a concrete where the short fiber (A) alone is used can be avoided by the use of the short fiber (B) serving as a viscoelastic material.

EMBODIMENTS OF THE INVENTION

Figure 1:
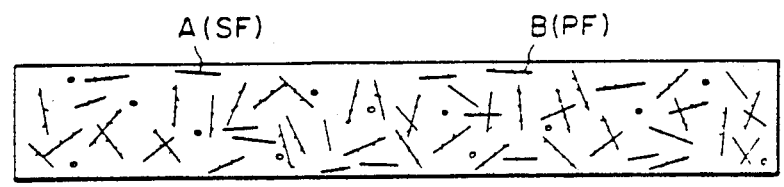
FIG. 1 is a schematical view, in section of a concrete according to the invention.

In general, the Young's modulus of composite materials varies depending on the composition and manufacturing conditions thereof and that of concrete is in the range of about 2,000–4,000 kg/mm$^2$ (Young's modulus measured under ASTM-C469-65).

The short fiber (A) has a Young's modulus higher than that of the concrete, preferably ranging about 4,500–30,000 kg/mm$^2$. Fibers having such a higher Young's modulus as mentioned above are, for example, steel fibers (such as a steel fiber, a stainless steel fiber, a galvanized steel fiber, etc.) or glass fibers or, carbon fiber. The steel fibers have a Young's modulus ranging about 19,000–21,000 kg/mm$^2$ (Young's modulus measured under ASTM E111-61) and that of the glass fibers ranges about 5,000–8,000 kg/mm$^2$. The steel fibers are most preferable as the short fiber (A) and the fibers of this type are disclosed in U.S. Pat. No. 3,953,953. They are in the form of a disc or square shape or a modified disc or square in section, and of a rod or wire or a twisted rod as a whole, with or without being processed at ends thereof, and they are produced by the method of shearing or cutting the steel plate, cutting the steel wire and of melt extraction of steel. They have generally a thickness or diameter of 0.2–1 mm and a length of 20–60 mm.

The short polymer fiber (B) having such a small Young's modulus as mentioned above is, for example, synthetic resin fibers such as polyester, polyamide, polyolefins, (polypropylene, polyethylene and olefin copolymers), and the like. The Young's moduli of these fibers are in the range of about 100–1,000 kg/mm$^2$ (Young's modulus measured under ASTM D3379-75).

In order to attain good adhesion to the concrete, the surfaces of the fibers are preferable to be irregular rather than smooth. Conveniently, the fibers useful in the present invention are those including branched, knapped or nobbly fibers or fibers which are formed with warts or sawtooth-like projections or indentations along the axis of fiber. These projections may be arranged regularly or irregularly. High adhesion to concrete is ensured when the projections are formed discontinuously rather than continuously. The fibers of such a configuration as mentioned above are described, for example, in British Pat. Nos. 1,010,143 and 1,305,206 and U.S. Pat. Nos. 3,127,915 and 3,567,569.

In a preferred aspect, the short fiber (A) is a steel fiber and the short fiber (B) is a polyethylene short fiber in combination. Most preferably, the polyethylene short fiber has projections or is made irregular on the surface thereof so as to enhance the adhesiveness to concretes. It has a length of 5–100 mm, preferably 10–80 mm, most preferably 20–60 mm, and a thickness of 100–50,000 denier, preferably 1,000–15,000 denier, most preferably 3,000–12,000 denier. The number of projections like sawtooth is 5–25 per the length of 10 cm, preferably 7–20, most preferably 10–16, the height of projection is 0.1 mm or more, and the diameter of the fiber is 0.5–2 mm.

These parameters are determined depending on the uniform dispersability of the fibers into concrete and the physical properties of the reinforced concrete desired.

For instance, a polyethylene fiber having such a configuration can be obtained by melt blending a high density polyethylene with a melt index of 0.01–1.0 g/10 min. (as measured on the basis of ASTM D1238-65T at 190° C. under the load of 2.16 kg) with 10–80 wt% of a high density polyethylene with a melt index below 0.01, extruding the blend into filaments under conditions where the melt fracture occurs, cooling and then stretching the filaments under orientation conditions lower than the melting point of the filaments, and cutting them in a given length.

The polyethylene fiber of this type is described in U.K. Patent Application No. GB2025841A. and U.S. Pat. No. 4,297,414. The polyethylene fiber shows high mechanical strengths when oriented in a lengthwise direction and has a Young's modulus of about 500 kg/mm$^2$.

The short fibers (A) and (B) are used in combination and the mixing ratios in concrete, i.e. a total amount of the short fibers (A) and (B), amounts of the respective fibers and a mixing ratio of the fibers (A) and (B), are important in the practice of the invention.

The total amount of the short fibers (A) and (B) is in the range of 1–6% by total volume of a concrete used.

Less amounts than 1 vol% are disadvantageous since a significant reinforcing effect does not develop, while larger amounts than 6 vol% are disadvantageous in that the fibers tend to be tangled and are difficult to be uniformly dispersed in a concrete matrix, with the result that the concrete is lowered in strength and also in working property to a considerable extent, making it difficult to apply such a concrete. The mixing ratio is expressed by volume % in 1 m$^3$ of a concrete composition composed of cement, water, fibers, fine or coarse aggregates such as sand, broken stone and gravel, and the like. If necessary, other additives or improvers may be added to the composition.

The amounts of the respective fibers (A) and (B) are as follows: An amount of the short fiber (A) is in the range of 0.5–3 vol%, preferably 1–2 vol%; and an amount of the short fiber (B) is in the range of 0.5–5 vol%, preferably 1–4 vol%. Good results are obtained when the mixing ratio of the two fibers B/A is in the range of 0.5–6, preferably 1–3.

In accordance with the present invention, a reinforcing material composed of a mixture of the above-described short fibers (A) and (B) is also provided. In practice, the short fiber (A) of steel and the short fiber (B) of polyethylene are mixed in a mixing volume ratio B/A of 0.5–6 and then packed such as in a bag or a box to give a packed reinforcing material.

The short fiber (A) and (B) of the present invention have high rigidity and a less possibility of entanglement, and thus have an improved dispersibility into concrete matrix. Accordingly, it is possible to thoroughly mix the fibers with concrete by means of an ordinary mixer with ease.

The fibers can uniformly be dispersed in the concrete without formation of fiber balls, thus giving a final product having a uniform distribution of the reinforcing material and no irregularity in strength. By virtue of the protrusions, the short fibers have an improved anti-slipping out strength against the flexural stress exerted on the concrete material in which it is embedded. Accordingly, the flexural strength, impact strength and cracking strength of the concrete material are thereby increased, and the falling off of edges of the concrete material is thereby minimized.

The fiber-reinforced concrete of the present invention may be used for runways, beams for bridges, tunnels, flat plates, corrugated plate, pipe, construction blocks or the like.

In addition, the reinforced concrete in which the two fibers are incorporated according to the invention is superior in abrasion resistance to those where the fibers are dispersed singly, leading to an increasing durability, when applied as drainage canals of dam or sandbank fixing dams.

The present invention will be illustrated by way of the following example.

EXAMPLE

In FIG. 1 there is shown a concrete of the invention in which short fibers (A) and (B) are dispersed.

Figure 2A:
FIGS. 2a and 2b are, respectively, schematical enlarged views of short fiber (A) and short fiber (B)
Figure 2B:
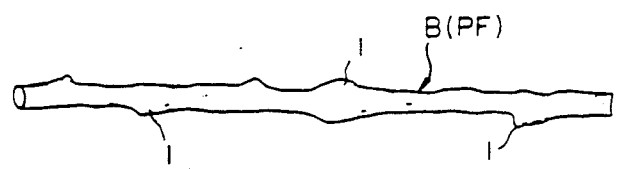

The short fiber (A) used was a steel fiber {Young's modulus: $200 \times 10^4$ (kg/cm$^2$)} (hereinlater abbreviated as SF) composed of sheared fibers having a size of $0.3 \times 0.7 \times 30$ mm (FIG. 2a) and the short fiber (B) was a high density polyethylene fiber {Young's modulus: $2.2 \times 10^4$ (kg/cm$^2$)} (hereinlater abbreviated as PF) which had a specific density of 0.96 g/cm$^3$, a calculated diameter of 0.9 mm, a thickness of 5500 denier, and a length of 40 mm and which was oriented in a lengthwise direction and had branched or warts-like projections (1), (1) . . . at given intervals in the fiber axial direction (FIG. 2b).

The concrete matrix {Young's modulus: $35 \times 10^4$ (kg/cm$^2$)} has a water-to-cement ratio or 50:50 and the cement used was a high early strength Portland cement. The aggregate has a maximum size of 15 mm.

Samples were in the form of a beam having a size of $10 \times 10 \times 40$ cm and a flexural test based on ASTM C78-75 was conducted by a two points loading on tri-sectional points (span, 30 cm).

The loading test was carried out using a material tester of the displacement control type (floor type TT tester by Instron Co., Ltd.). As for the loading speed, four cross head speeds (C.H.S.) of 0.5, 20, 100 and 200 mm/min. were used.

Test samples were inventive samples (Nos. 1-4) using combinations of steel and polyethylene fibers and control samples (Nos. 5-9) in which the steel fiber or polyethylene fiber was singly incorporated, respectively.

The amounts of the respective fibers in the samples are shown in the following table.

Figure 3:
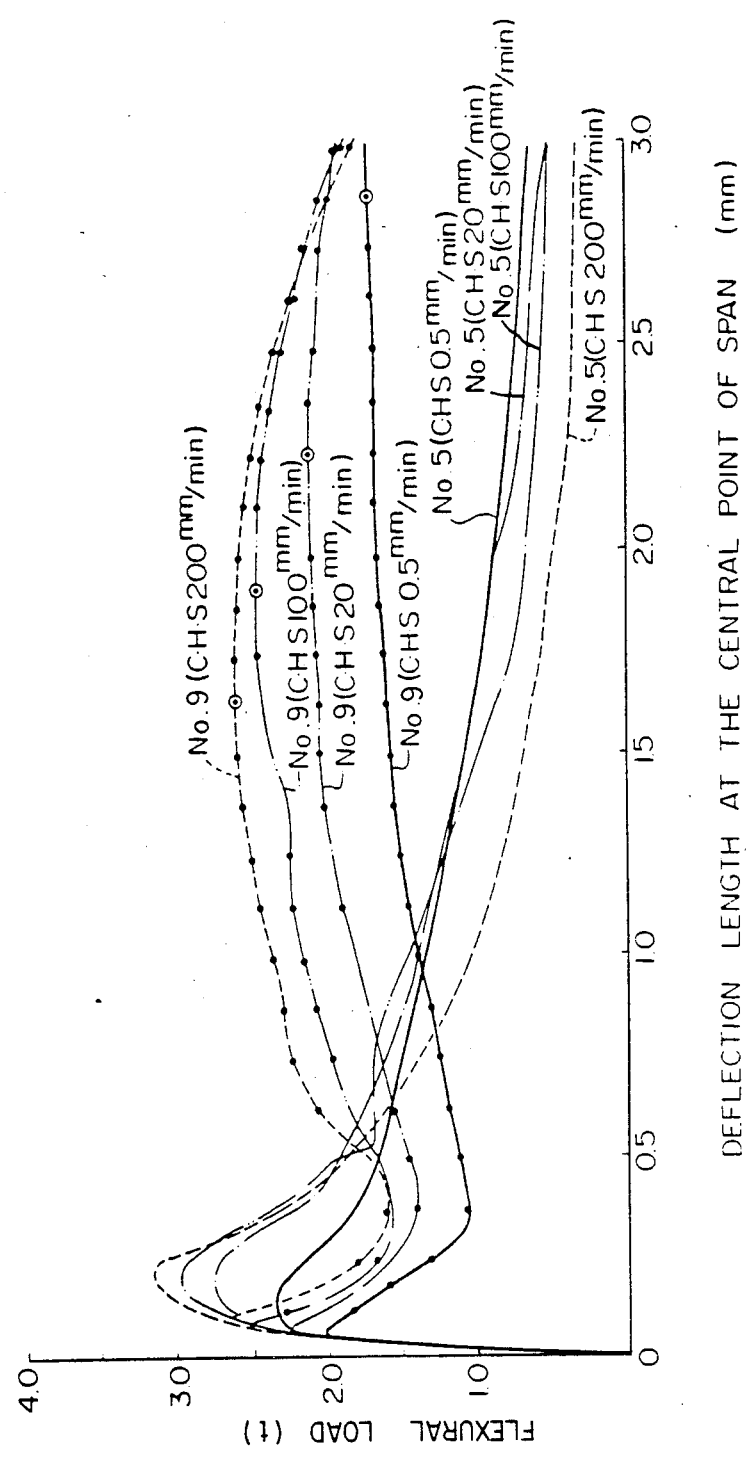
FIG. 3 is a graphical representation of deflection length (mm) of a steel fiber-reinforced concrete for comparison and a polymer fibers-reinforced concrete with relation to flexural load (t) for different loading speeds.

FIG. 3 shows an influence of the loading speed on the flexural load-deflection curves of concretes using steel and polyethylene fibers. As is apparent from the figure, with the PF-reinforced concrete (sample No. 9), there are tendencies that a higher loading speed results in larger craze-generating load and after a temporary lowering of the yield strength, the yield strength reaches a second peak, indicated by , at a relatively early stage of deformation and that a rate of lowering of the yield strength becomes relatively large when the second peak is passed over.

Similar tendencies are observed in the case of the SF-reinforced concrete (sample No. 5), i.e. a larger loading speed results in a higher maximum strength and a rate of lowering of the load-flexural strength accompanied by an increase of deformation becomes slightly great.

Figure 4:
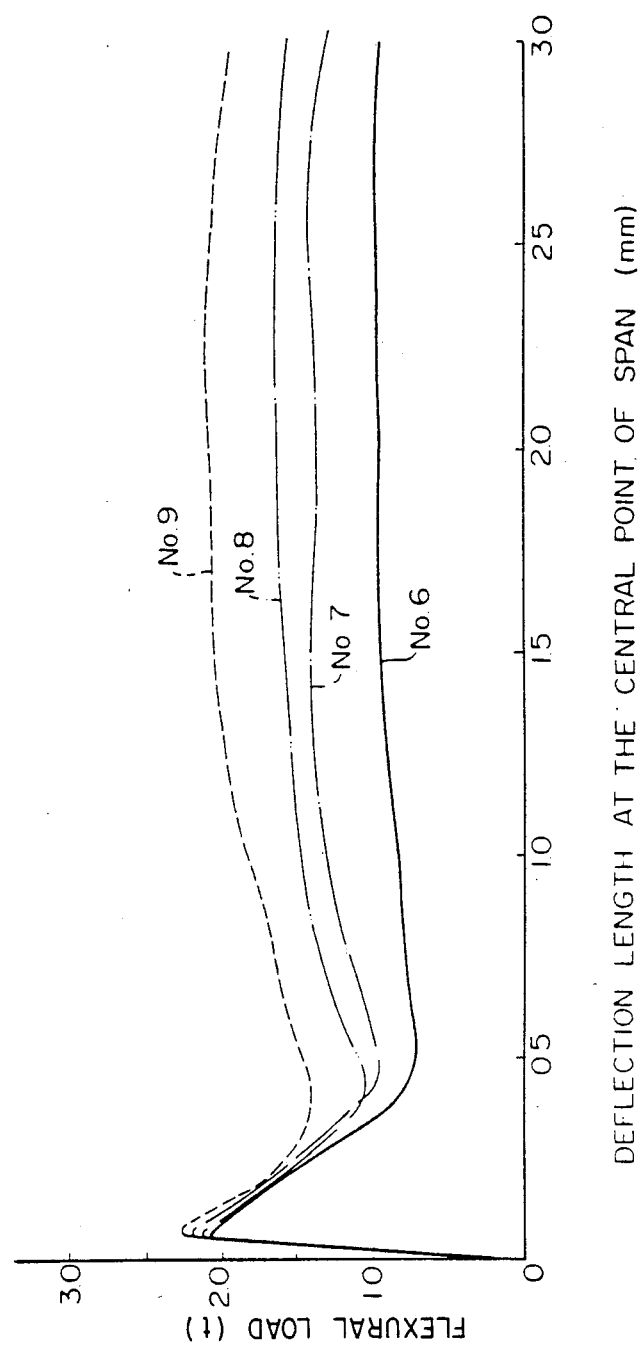
FIG. 4 is a graphical representation of deflection length of polymer fiber-reinforced concretes with relation to flexural load at a constant loading speed.

FIG. 4 shows an influence of a mixing amount of the polyethylene fiber on the flexural load-deflection characteristic of PF-reinforced concretes (sample Nos. 6-9) when the loading speed is held constant (20 mm/min.), from which it is found that a larger amount of PF leads to a smaller lowering of the yield strength after generation of crazes.

Figure 5:
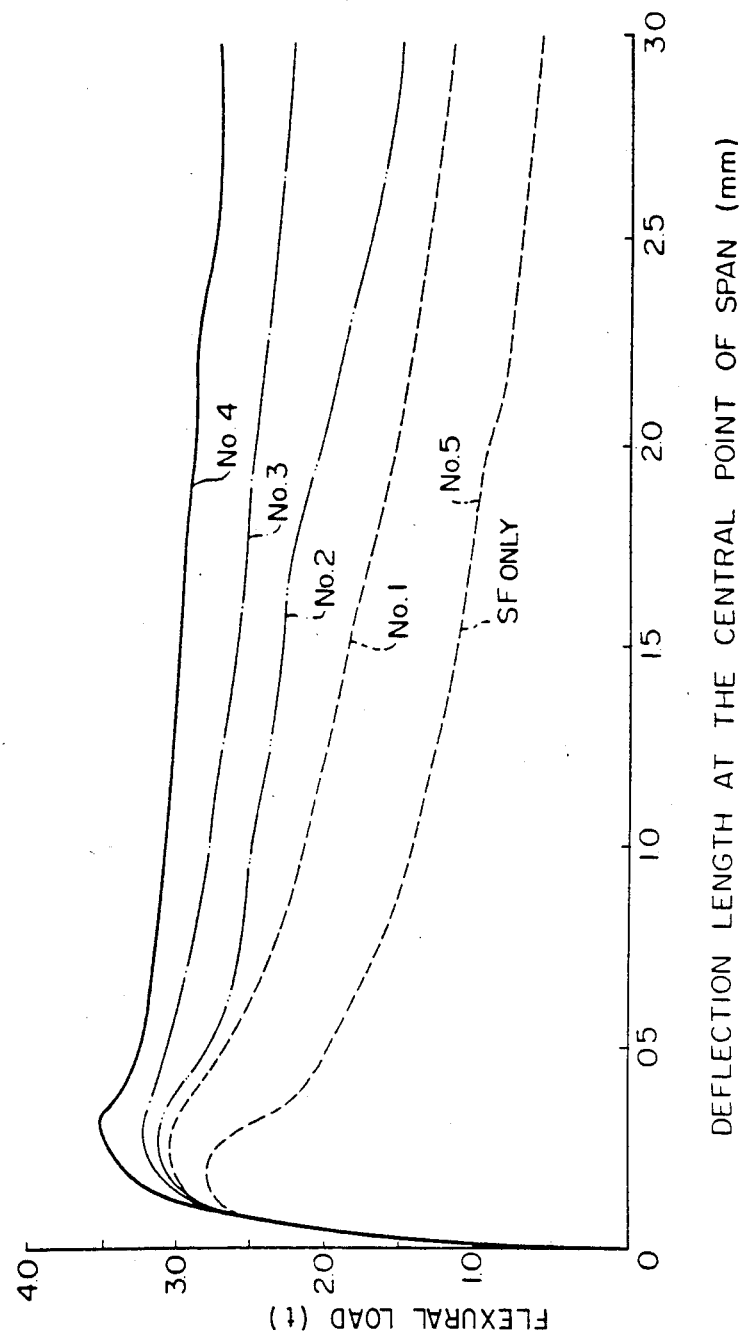
FIG. 5 is a graphical representation of deflection length of concretes according to the invention with relation to flexural load.

FIG. 5 shows flexural load-deflection curves of the sample Nos. 1-4 of the invention. In the figure, the broken line shows a flexural load-deflection curve of a reinforced concrete dispersed with SF alone (sample No. 5).

As is apparent from the figure, the flexural load-deflection characteristic of the samples of the invention is clearly different from that of the SF-reinforced concrete or PF-reinforced concrete (see FIG. 3).

That is, the flexural load-deflection behaviors of the inventive samples are as follows: (1) The maximum loads are higher than that of the SF-reinforced concrete and degrees of corresponding deflection are also larger; (2) The lowering of the yield strength involved by a subsequent deformation becomes very small; and (3) The samples with a greater mixing ratio of PF show more remarkable tendencies of the above items 1 and 2. These results are considered due to a synergistic effect of SF and PF.

Especially, the sample No. 4 (SF: 1.0 vol%, PF: 3.0 vol%) shows an excellent toughness which is similar to the load-deformation characteristic at the yield point of a soft steel.

Figure 6:
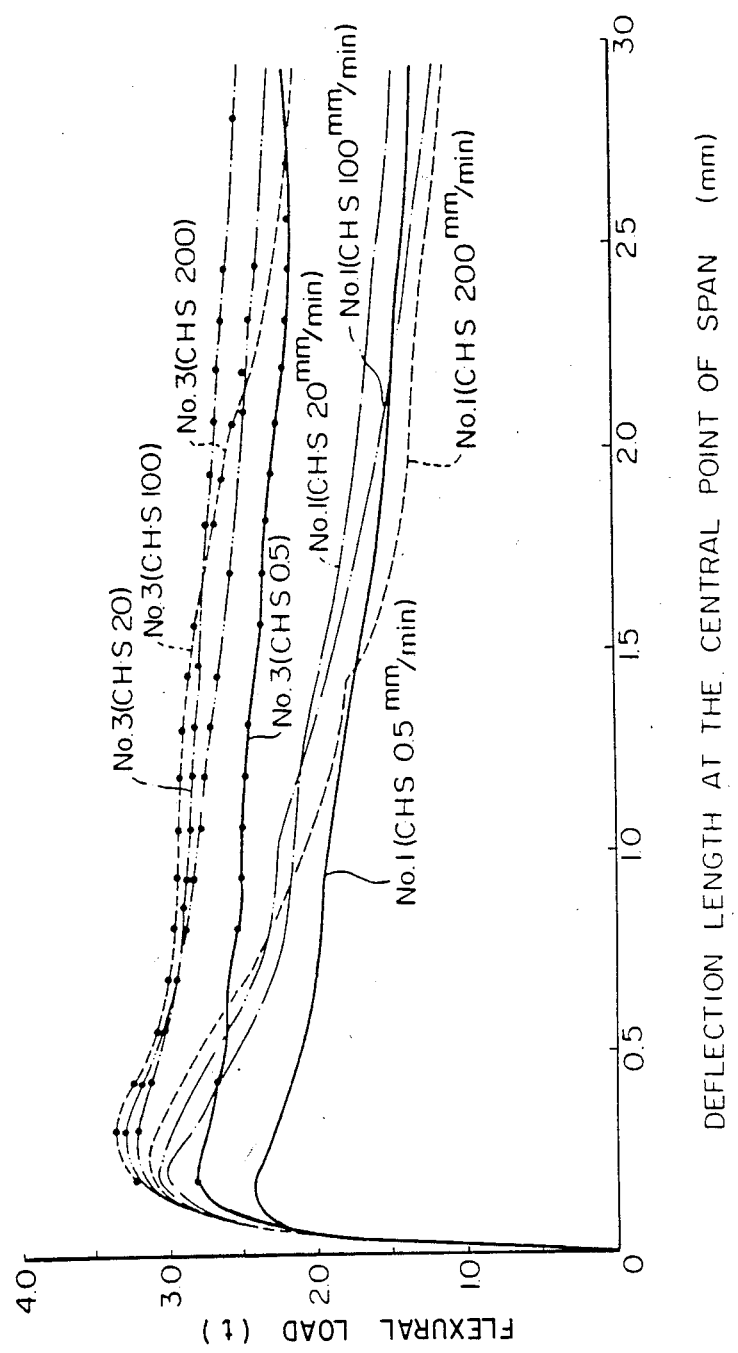
FIGS. 6 and 7 are graphical representations of deflection length of concretes according to the invention with relation to flexural load for different loading speeds.
Figure 7:
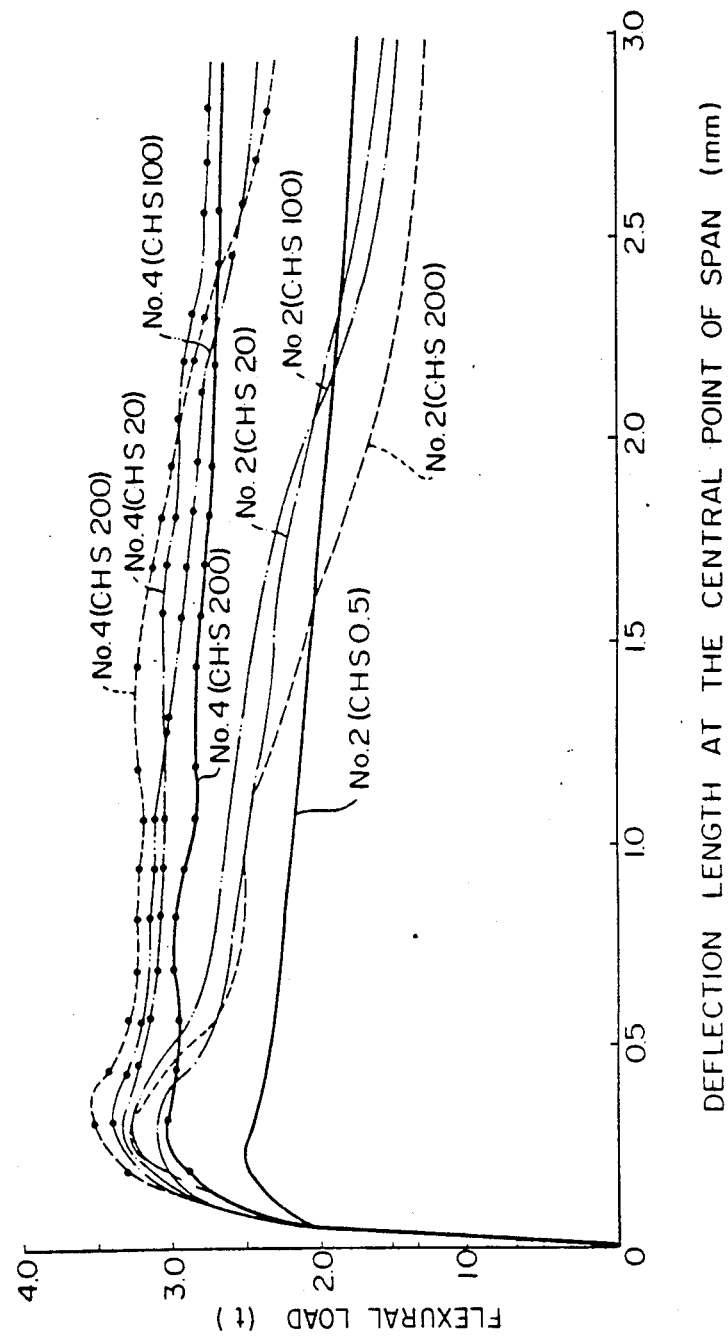

FIGS. 6 and 7 show flexural load-deflection curves obtained by testing the sample Nos. 1-4 of the invention at four different loading speeds.

As is apparent from these figures, the influence of the loading speed on the flexural load-deflection behaviors involves the following tendencies: a higher loading speed results in (1) a larger degree of deflection at the maximum load in all the samples and also in a higher maximum load; (2) A higher amount of PF leads to a higher maximum load; and (3) the lowering of the yield strength after the maximum load is small until the degree of deflection reaches a certain level, after which the lowering of the yield strength is more considerable as compared with the case using a smaller loading speed.

It is believed that these results suggest that the mechanical characteristic of the samples of the invention is obtained from addition of flexural load-deflection characteristics obtained by changing the speed of a flexural test using concretes containing SF or PF.

Figure 8:
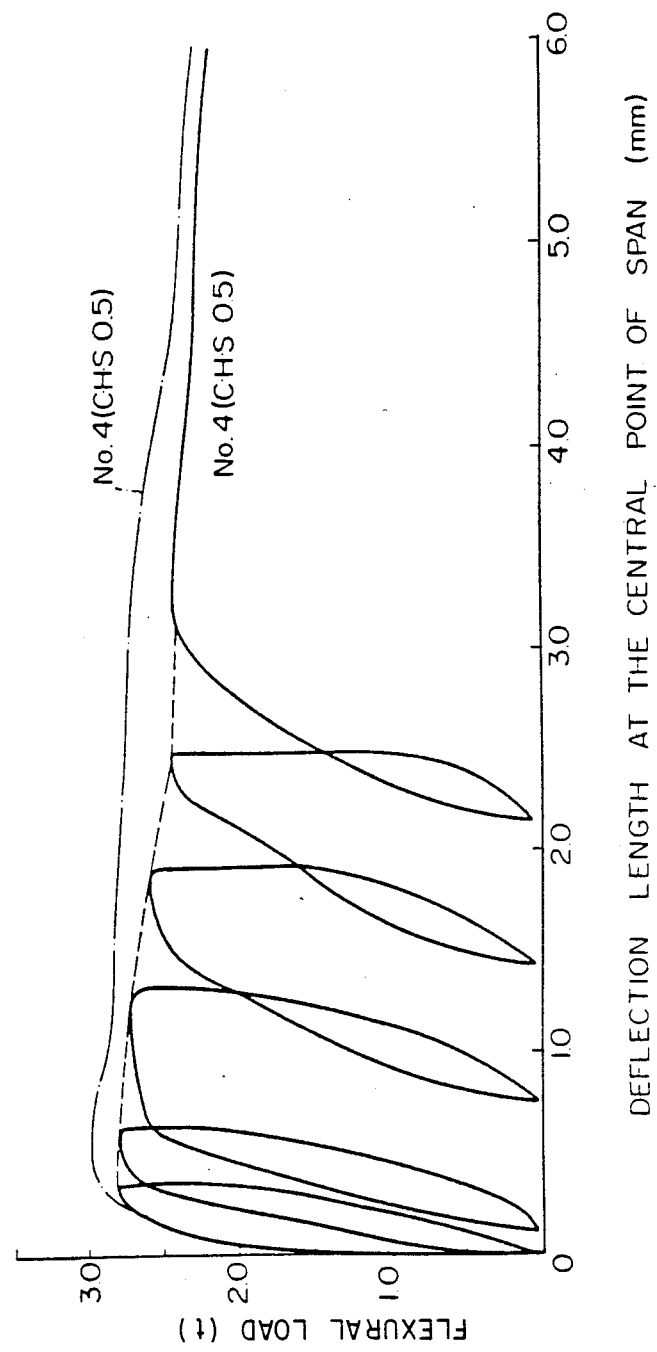
FIG. 8 is a graphical representation of deflection length of a reinforced concrete according to the invention with relation to flexural load applied by simple and repeated loading procedures.

FIG. 8 shows a flexural load-deflection curve (dot-and-dash line) and a repeated loading-deflection curve (solid line) obtained by carrying out a simple loading and a repeated loading on the reinforced concrete (sample No. 4) according to the invention. The broken line shows an envelope of maximum loads obtained by repetitions of loading.

As is clearly seen from the repeated loading-deflection curve of the figure, the load-deflection characteristic is almost the same as a simple flexural load-deflection curve though a residual amount of deflection increases due to an increasing width of crazes. When the deflection length is 6 mm, the yield strength is kept at about 75% of the maximum load in each sample, thus showing an excellent toughness.

It was confirmed that the yield strength was lost at the deflection length of about 10 mm in this example though depending on the length of the fibers used.

In this example, the toughness of the fiber-reinforced concretes was quantitatively evaluated by calculating an area surrounded by the flexural load-deflection curve and the axis of abscissa (deflection length) in which a vertical line is drawn from the curve at a point, where the yield strength corresponded to 80% of the maximum load, to the axis, and then determining a ratio of the area to an area of the SF-reinforced concrete (sample No. 5), with the results shown in the following table. The evaluation at the respective loading speeds was based on an area of the SF-reinforced concrete (sample No. 5) obtained at each loading speed.

| | Short Fiber | | Inventive samples Loading Speed (mm/min.) | | | |
|---|---|---|---|---|---|---|
| | SF | PF | 0.5 | 20 | 100 | 200 |
| No. 1 | 1.0 | 1.0 | 2.47 | 8.40 | 8.30 | 8.20 |
| No. 2 | 1.0 | 1.5 | 5.46 | 5.91 | 5.20 | 5.69 |
| No. 3 | 1.0 | 2.0 | 7.59 | 2.89 | 4.78 | 2.20 |
| No. 4 | 1.0 | 3.0 | 10.14 | 1.91 | 1.41 | 2.00 |
| No. 5 | 1.0 | 0 | 1.0 | 1.0 | 1.0 | 1.0 |

From the above table, the flexural toughness of the samples of the invention is found to show the following tendencies: (1) It increases with an increase of the PF amount and the sample No. 4 having a PF content of 3.0 vol% has a toughness of about 10 times as great as that of the SF-reinforced concrete (No. 5) at a loading speed of 0.5 mm/min and of about 8 times at a loading speed of 20-200 mm/min; and that in all the samples, the greatest toughness is obtained at a loading speed of 0.5 mm/min and the toughness values are almost held constant at loading speeds ranging 20-200 mm/min in each sample.

These tendencies show that the characteristic of the PF serving also as a viscoelastic material gives some influence on the toughness. Anyway, it is clear that the reinforced concretes according to the invention show such an excellent toughness as not attained by the SF-reinforced concrete.

What is claimed is:

1. A fiber-reinforced, craze-resistant and high tensile strength concrete composite comprising a concrete matrix containing from 1 to 6% by volume of a mixture of short steel fibers (A) having a length of about 20 to 60 mm. and a Young's modulus higher than that of concrete and short polyethylene fibers (B) having a length of about 5 to 100 mm. and a Young's modulus lower than concrete, said fibers (B) further having surface protrusions along the longitudinal axis so that the fiber is firmly adhesive to the concrete matrix, with both of said fibers being dispersed in the concrete matrix in a volume ratio (B)/(A) ranging from about 0.5 to 6, the reinforcing amount of short steel fibers (A) ranging from about 0.5 to about 3% by volume and the reinforcing amount of short polyethylene fibers (B) ranging from about 0.5 to about 5% by volume.

2. The fiber-reinforced concrete composite as defined by claim 1, said steel fibers having a Young's modulus ranging from about 19,000 to 21,000 kg/mm$^2$, being about 0.2 to 1 mm in thickness.

3. The fiber-reinforced concrete composite as defined by claim 1, said short steel fibers (A) having a Young's modulus ranging from about 4,500 to about 30,000 kg/mm$^2$, being about 0.2 to 1 mm in thickness.

4. The fiber-reinforced concrete composite as defined by claim 3, said polyethylene fibers having a denier ranging from about 100 to 50,000.

5. The fiber-reinforced concrete composite as defined by claim 3, said surface protrusions are of a number ranging from about 5 to 25 per each 10 cm length of fiber (B), having a height of at least 0.1 mm and a diameter of fiber (B) ranging from about 0.5 to 2 mm.

6. The fiber-reinforced concrete composite as defined by claim 4, said surface protrusions being of a number ranging from about 5 to 25 per each 10 cm length of fiber (B), having a height of at least 0.1 mm and a diameter ranging from about 0.5 to 2 mm.

7. The fiber-reinforced concrete composite as defined by claim 6, said polyethylene fibers being longitudinally oriented and having a Young's modulus of about 500 kg/mm$^2$.

8. The fiber-reinforced concrete composite as defined by claim 1, the amount of the short fibers (A) ranging from about 1 to 2% by volume, and the amount of the short fibers (B) ranging from about 1 to 4% by volume.

9. The fiber-reinforced concrete composite as defined by claim 1, the ratio (B)/(A) ranging from about 1 to 3.

10. A craze-resistant, high tensile strength reinforced concrete comprising the fiber-reinforced concrete composite as defined by claim 1.

11. The fiber-reinforced concrete composite as defined by claim 5, said number ranging from about 7 to 20 per each 10 cm length of fiber (B).

12. The fiber-reinforced concrete composite as defined by claim 5, said number ranging from about 10 to 16 per each 10 cm length of fiber (B).

13. The fiber-reinforced concrete composite as defined by claim 6, said polyethylene fibers being about 10 to 80 mm in length, and having a denier ranging from about 1,000 to 15,000.

14. The fiber-reinforced concrete composite as defined by claim 6, said polyethylene fibers being about 20 to 60 mm in length, and having a denier ranging from about 3,000 to 12,000.

15. The fiber-reinforced concrete composite as defined by any of claim 3 or 2, said short reinforcing fibers (B) having a Young's modulus ranging from about 100 to about 1,000 kg/mm$^2$.

16. Craze-resistant, high tensile strength reinforced concrete element made from said concrete composite of claim 1.

* * * * *